United States Patent [19]

Vukanovic et al.

[11] Patent Number: 4,505,947

[45] Date of Patent: Mar. 19, 1985

[54] METHOD FOR THE DEPOSITION OF COATINGS UPON SUBSTRATES UTILIZING A HIGH PRESSURE, NON-LOCAL THERMAL EQUILIBRIUM ARC PLASMA

[75] Inventors: Vladimir Vukanovic; Susannah M. Butler; George Fazekas; John R. Miller, all of Rochester, N.Y.

[73] Assignee: The Standard Oil Company (Ohio), Cleveland, Ohio

[21] Appl. No.: 398,005

[22] Filed: Jul. 14, 1982

[51] Int. Cl.³ .............................................. B05D 1/08
[52] U.S. Cl. ................. 427/34; 219/121 PL; 427/37; 427/423
[58] Field of Search ............ 427/34, 37; 219/121 PM, 219/121 PP, 121 PR, 121 PV, 121 PL

[56] References Cited

U.S. PATENT DOCUMENTS

| | | | |
|---|---|---|---|
| 3,677,807 | 7/1972 | Curtis et al. | 427/423 |
| 3,925,177 | 12/1975 | Kofoid et al. | 427/37 |
| 4,003,770 | 1/1977 | Janowiecki et al. | 427/34 |
| 4,024,617 | 5/1977 | McCormick | 427/34 |
| 4,292,342 | 9/1981 | Sarma et al. | 427/34 |

Primary Examiner—John H. Newsome
Attorney, Agent, or Firm—J. A. Wyand; J. G. Curatolo; L. W. Evans

[57] ABSTRACT

A method is provided for the deposition of coatings upon substrates utilizing a high pressure, non-local thermal equilibrium arc plasma including the steps of generating a non-LTE arc plasma at a pressure greater than about 0.1 atmospheres, introducing a coating material into the arc plasma, positioning a substrate material proximate to the arc plasma whereby activated species of said coating material formed by the arc plasma contact the substrate to form a coating.

52 Claims, 4 Drawing Figures

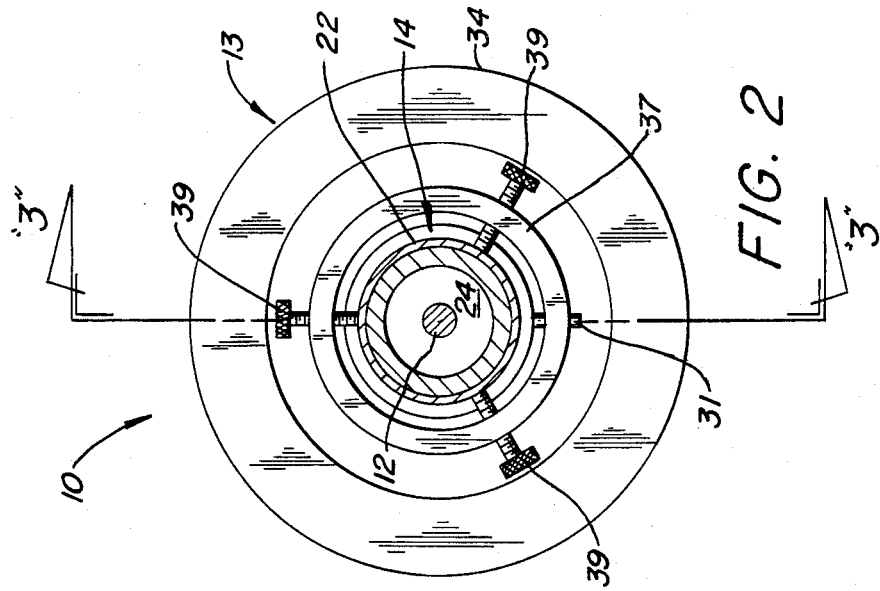
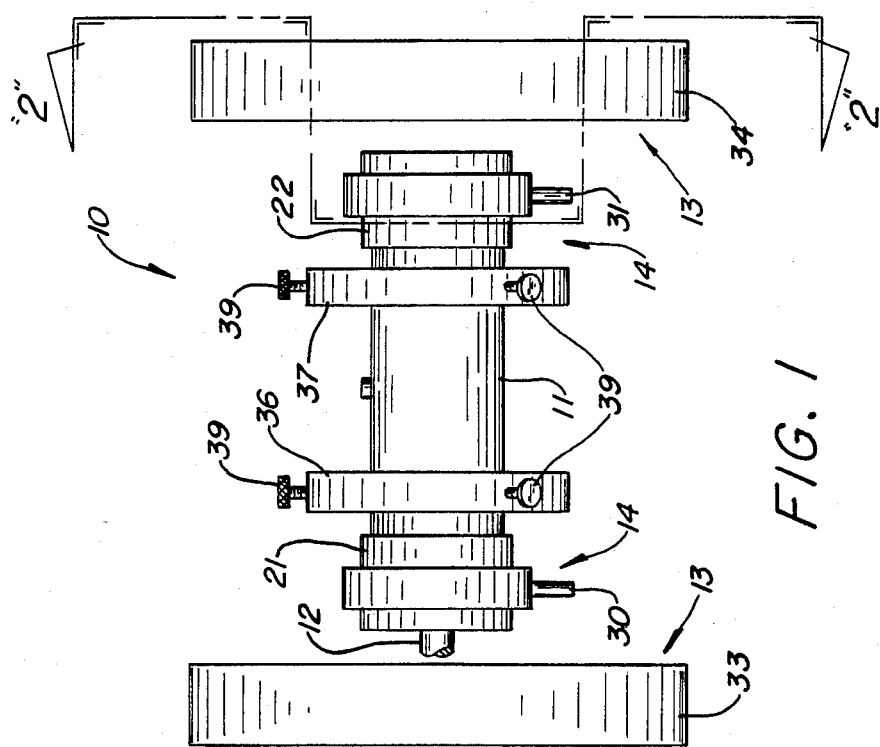

METHOD FOR THE DEPOSITION OF COATINGS UPON SUBSTRATES UTILIZING A HIGH PRESSURE, NON-LOCAL THERMAL EQUILIBRIUM ARC PLASMA

BACKGROUND

The present invention relates generally to the deposition of coatings upon substrates by utilizing non-local thermal equilibrium arc plasmas. More particularly, the present invention pertains to a method for the deposition of coatings upon substrates, preferably at atmospheric pressure, by utilizing a non-local thermal equilibrium rotating arc plasma. Substrates which may be coated include conductive or non-conductive substrates for semiconductor applications, and glass microballoons utilized as nuclear fuel targets for inertial confinement fusion processes.

Generally, plasma methods for coating substrates such as semiconductor substrates and laser fusion targets are low pressure processes. One method used in the coating of fusion targets is magnetron sputtering either in a batch of bouncing targets or with one target levitated on a gas jet. However, if the targets are bounced during the deposition process, the coating can be damaged or the targets tend to adhere to the bouncing plate or to each other due to either electrostatic interactions or cold welding. Levitation processes using gas jets during the coating process are hampered due to the electrostatic interaction between the target and the levitator, while the low pressure required for sputtering hampers the levitation process.

The deposition of semiconductor materials upon semiconductor substrates has been effected using low pressure deposition processes such as thermal or plasma assisted chemical vapor deposition or glow discharge, sputtering, and thermal evaporation. The low pressure plasma deposition processes characteristically exhibit low deposition rates, and where plasma assist is used, low yields of plasma chemical reactions. It is desired, however, to maintain the non-local thermal equilibrium characteristics of the low pressure plasma, which include the existence of free atoms and radicals existing at low temperatures. In non-local thermal equilibrium plasmas, there exist low densities of electrons and molecular species. Additionally, the temperature of the atomic, free radical and molecular species, in ground, ionized or excited states, is much less than the temperature of the electrons.

The use of high pressure plasmas for the deposition of coating materials upon substrates has been proposed, as in U.S. Pat. Nos. 4,003,770 and 4,292,342.

U.S. Pat. No. 4,003,770 describes a normal plasma spraying process, in which the material is heated with the arc such that molten particles of the coating material are ejected onto the substrate. This is not tailored to allow specific desired chemical reactions to take place, as in the present invention where atomic-sized species of the coating material or materials are activated and these activated species are deposited upon the substrate.

U.S. Pat. No. 4,292,342 describes a high pressure plasma process which utilizes a local thermal equilibrium process. Deposition rates using high pressure plasma sources are increased, and the yield of plasma chemical processes is greater. However, when utilizing high pressure local thermal equilibrium plasmas, there are virtually no activated atomic or free radical species at low gas temperatures. All species, including electron, molecular, atomic and radical species exist at nearly the same temperature. Quenching of the deposition reaction is often necessary, and the high temperature involved severely limits the types of deposition materials and chemical interactions which may be utilized.

It is therefore an object of the invention to provide a method for the deposition of coating materials upon substrates utilizing a high pressure plasma source to activate species of the coating material for deposition, while maintaining non-local thermal equilibrium characteristics such that the activated species exist at a temperature below the electron temperature for the plasma.

SUMMARY OF THE INVENTION

In high pressure plasmas characterized by local thermal equilibrium, the temperatures of all plasma species, including electron, molecular, atomic and radical species exist at nearly the same temperature. In non-local thermal equilibrium plasmas, however, atomic and free radical species exist at temperatures much lower than the electron temperature. In conventional plasma jets, both the axial and radial temperature distributions of the species present are inhomogeneous.

According to the method of the present invention, a high pressure, non-LTE plasma is generated in an arc, and motion of the arc is induced. In the preferred geometry of the system utilized, the anode takes the form of a tube and the cathode is a rod in the center of the tube. In a magnetic field, the arc plasma between the cathode and anode rotates around the interior periphery of the anode, forming a time integrated picture of a rotating disk. In a rotating plasma, the residence time of particles in the plasma increases, particularly for those particles which have a high degree of ionization. However, particles with a low degree of ionization can also be captured several times in the rotating plasma. The temperature distribution of the atomic and radical species in the plasma between the cathode and the periphery of the anode is found to be relatively homogeneous, (although electron temperatures still differ from the temperature of the atomic and radical species), and susceptible for use in the activation of atomic and radical species to permit the smooth coating of substrates.

In general, the process of the present invention includes a method for coating substrates including, generating a non-local thermal equilibrium arc plasma at a pressure of at least 0.1 atmospheres, introducing a coating material into the arc plasma, and positioning a substrate material proximate to the arc plasma, whereby species of said coating material formed by the arc plasma contact the substrate to form a coating.

It is preferred that the arc plasma generated is subjected to a magnetic field capable of inducing movement of the arc plasma, most preferably a rotation of the arc in order to produce a more homogenous temperature distribution, and to increase the residence time of species in the plasma.

According to one embodiment of the invention, coated substrates are prepared by establishing electric field conditions in which an arc plasma may exist in non-local thermal equilibrium between a first electrode and a second electrode proximate said first electrode, establishing a magnetic field in the region of said first electrode and said second electrode to induce motion of the arc plasma, establishing and maintaining at least in a region between the first electrode and second electrode a preselected gaseous environment at a pressure of at least approximately 0.1 atmospheres, introducing a coating material into the arc plasma, and positioning a substrate material proximate to the arc plasma, whereby activated species of said coating material formed by the arc plasma contact the substrate to form a coating.

In one embodiment of the invention, a semiconductor is made by generating a non-LTE arc plasma at a pressure greater than about 0.1 atmospheres, introducing at least one semiconductor component element into the arc plasma, positioning a substrate material proximate to the arc plasma, whereby activated species of said semiconductor material formed by the arc plasma contact the substrate to form a semiconductive region.

Also according to the present invention, a photovoltaic semiconductor device is made by generating a non-LTE arc plasma at a pressure greater than about 0.1 atmospheres, introducing at least one photoresponsive semiconductor component element into the arc plasma, positioning a substrate material proximate to the arc plasma, whereby activated species of said semiconductor element formed by the arc plasma contact the substrate to form a semiconductor region.

Electrical conductors may be provided by conventional means to conduct the flow of electricity produced by illuminating the device. The device preferably is made with p-type, intrinsic, and n-type regions.

The present invention also includes articles and devices made by the subject methods.

BRIEF DESCRIPTION OF THE DRAWINGS

FIG. 1 is a front elevational view of an exemplary apparatus in accordance with the concept of the present invention having a cathode feed reservoir for the introduction of the deposition material into the plasma (seen in FIG. 3), and an exit orifice to effect deposition external to the anode in a plasma jet.

FIG. 2 is a side elevational view of the apparatus depicted in FIG. 1 taken substantially along line 2—2 of FIG. 1.

DETAILED DESCRIPTION OF THE INVENTION

Figure 3:
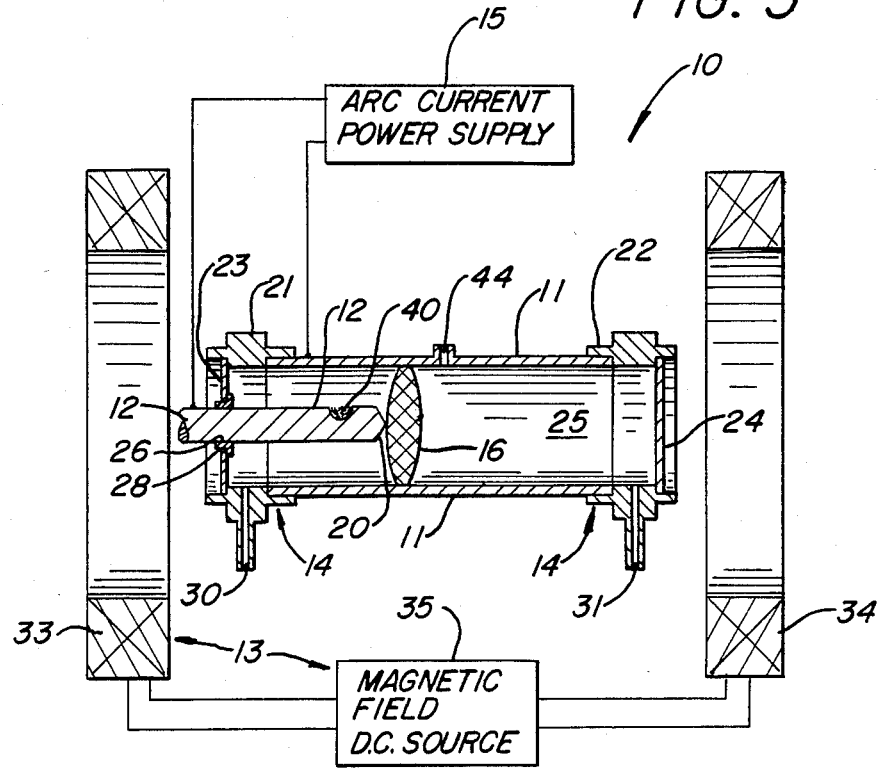
FIG. 3 is a vertical cross-sectional view of the apparatus depicted in FIGS. 1 and 2 taken substantially along line 3—3 of FIG. 2.

According to the process of the present invention, a non-local thermal equilibrium (non-LTE) arc plasma is generated in the presence of a gas between a cathode and an anode of a plasma generating apparatus. The gas comprises an inert gas such as argon, xenon, krypton, helium or the like. The gas is introduced into the region of the electrodes at a pressure greater than about 0.1 to about 3 atmospheres, preferably at a pressure of approximately 1 atmosphere.

Coating materials may be introduced into the plasma by several methods. By one method, the material may be placed on or in the cathode, where it is vaporized by the heat of the cathode and carried into the plasma region by a carrier gas, which may be selected from the gases set forth above. Alternatively, the material may be vaporized in the region of the electrodes by an external energy source such as a laser. By yet another method, the material may be volatilized external to the electrode region and transported into the region by the carrier gas, or may be introduced as fine particles in the carrier gas stream. Preferably, the coating materials are introduced into the region of the electrodes in a condensed state, such as a powder, granules, foil or thin wire, and are then volatilized in situ, most conveniently by the heat generated at or on the cathode. Coating materials may additionally be introduced into the region of the electrodes in the form of a gas, such as silane, or may be incorporated, if conductive, in a sacrificial cathode. Methods for introducing the coating materials are set forth in more detail below.

Suitable coating materials for deposition upon sustrates include silicon and other semiconductor component or dopant materials, including but not limited to germanium, phosphorous, boron, arsenic, nitrogen, aluminum, gallium, and the like, as well as metals, preferably those having a moderate to high ionization potential, including but not limited to zinc, copper, nickel, cobalt, iron, cadmium, silver, gold, platinum, palladium and the like. The choice of coating material selected depends upon the application for which the coated substrate is to be used.

According to the method of the present invention, coated substrates may be produced which include semiconductors, photovoltaic thin films, fusion target pellets or coated microballoons, high tolerance bearings and protective coatings such as passivation layers ($SiN_2$). Accordingly, substrates to be utilized may include glass microballoons, quartz, glass, or conductive metals such as aluminum, stainless steel, and the like.

Semiconductor material may be built up by the deposition process to form at least one discrete layer of one or more materials or elements, in order to conduct electricity. In particular, this method is suitable for forming photovoltaic thin films of polycrystalline or amorphous material useful in converting radiant energy into electricity. A material such as silicon or germanium may be deposited together with dopant and/or band gap altering elements. The types and proportions of the materials introduced into the region of the electrodes can be modified during the deposition process in order that discrete or graded layers of p, i and n material (as termed in the art) can be successively deposited, in any desired order.

One method of producing inertial fusion targets includes depositing layers of metal around deuterium-tritium, deuterium-deuterium or tritium-tritium fuel containing glass microballoons. The metal layers aid in the compression and heating of the nuclear fuel upon being struck by a laser pulse of appropriate energy to cause thermonuclear burn or nuclear fusion of the fuel material.

According to the method of the present invention, a non-LTE arc plasma is generated by impressing a voltage between the cathode and anode in the region of the electrodes causing breakdown of the gas in the electrode region. Gas is introduced into the region at a pressure of approximately 0.1 to 3 atmospheres, preferably about 1 atmosphere or greater. The coating material is introduced into the arc plasma as set forth above, preferably being volatilized in the region about the cathode and being carried into the arc plasma by the carrier gas. The coating material is excited into activated atomic and radical species by the arc plasma, these activated species being suitable for chemical reaction and deposition onto substrates. A substrate is positioned proximate to the arc plasma, and the activated species of the coating material which are formed in the plasma are carried by the gas away from the region of the electrodes to contact the substrate and form the coating.

The arc current utilized to generate the plasma may be as low as 0.5 amps, but generally is in the range of 2–10 amps, preferably about 3–6 amps. The arc current should not exceed amperage which, owing to the nature of the electrode materials utilized, the carrier gases introduced and the coating materials activated, would cause the arc plasma to lose its substantial non-LTE characteristics. This upper limit amperage can be determined experimentally for any combination of parameters listed. The voltage impressed upon the electrodes may be in the range of about 20 to about 200 volts. The magnetic field utilized to induce rotation of the arc plasma can be determined for the particular system utilized by visual observation of that point at which rotation is effected, although field strengths of about 80 to about 225 gauss have been used.

The temperature of the cathode varies along its length, although temperatures of about 4000°–6000° C. may exist at the tip of the cathode, with temperature rapidly decreasing away from the tip to temperatures of about 500°–800° C. in the area adjacent to the tapered portion of the cathode. The temperature of the plasma has been measured on the periphery of the arc at 200°–800° C., with temperatures of about 300°–500° C. being preferred. The temperature of the plasma jet which emerges from the exit orifice as described below, has been measured from 200°–700° C. The temperature of the plasma may be increased by increasing the arc current.

Deposition rates have been measured up to 1 micron per minute on substrates utilizing the method of the present invention. This rate represents at least a ten-fold increase over conventional low pressure non-LTE deposition processes. The rate at which the carrier gas is introduced into the system is dependent upon the temperature at which the plasma is to be operated, the desired residence time for activated species in the plasma and similar considerations, although flow rates of about 1.9–3.0 liters argon per minute at atmospheric pressure have been utilized with the apparatus described below.

SPECIFIC EMBODIMENTS OF THE INVENTION

Refering now to the drawings, below is described an apparatus suitable for carrying out the method of the present invention, having a cathode and anode for generating the plasma, means for causing movement of the arc plasma in order to maintain non-LTE conditions, means for introducing the coating materials to the electrode region, and regions for positioning substrates, permitting deposition of the excited or activated coating material upon the substrates.

FIGS. 1, 2 and 3 illustrate an apparatus, generally indicated by the numeral 10, for the deposition of materials upon substrates by means of an arc generated plasma operating under high pressure and non-LTE conditions. Apparatus 10 broadly includes anode 11, cathode 12, magnetic field generator 13, environmental control 14, and arc current power supply 15.

Anode 11 is a cylindrically shaped hollow electrode, preferably formed of a suitable conductive material such as graphite or tungsten, capable of withstanding the current and temperature conditions as are known to occur in generating an arc plasma. Cathode 12 is a cylindrically shaped electrode, smaller in diameter than that of anode 11 and tapered at one end 20, also preferably formed of a suitable conductive material similar to that of anode 11 and most preferably of graphite. The tapered end 20 of cathode 12 is extended coaxially within anode 11 by any appropriate mechanism such as that described hereinafter. In this configuration impression of the necessary voltage and current explained below between anode 11 and cathode 12 will result in an arc being struck between tapered end 20 of cathode 12 and the inner periphery of anode 11 radially closest thereto.

Environmental control 14 permits selected control of the environment between anode 11 and cathode 12 necessary for the maintenance of high pressure, non-LTE conditions in the arc plasma, and furnishes a vehicle by which the deposition material may be introduced into the arc plasma. Environmental control 14 includes two annular end plate housings 21, 22 into which the ends of anode 11 are inserted, and two end plates 23, 24 carried respectively in housings 21, 22, all of which together with anode 11 define a closed, hermetically sealed chamber 25 interior to anode 11. Of course, housings 21, 22 and end plates 23, 24 must be selected of material such as ceramics capable of withstanding the extreme temperatures (typically up to several thousand degrees centigrade) generated during operation of apparatus 10. Additionally, it may be useful to permit direct visual observation of the arc plasma during operation. Housings 21, 22 made of ceramics such as "Lava" material available from 3M Company, South Carolina, U.S.A., and end plates 23, 24 made of sapphire have been found to meet the necessary temperature constraints and permit relatively distortion free viewing of the arc plasma.

Cathode 12 may pass through a bore 26 in either end plate 23, 24 (for illustration purposes cathode 12 is shown passing through end plate 23) and a gasket 28 interposed between bore 26 and cathode 12 to more readily provide axial support to cathode 12 and maintain chamber 25 hermetically sealed from the ambient environment. Gas ports 30, 31 are bored respectively in housings 21, 22 in order to introduce, exhaust and maintain a preselected gaseous environment at a preselected pressure within chamber 25.

Deposition of materials carried as atomic species within an arc plasma may be greatly facilitated where the arc plasma is caused to move and most preferably to rotate in a preselected spatial region, maintaining non-LTE characteristics. An arc struck and caused to rotate within apparatus 10 between tapered end 20 of cathode 12 and the inner periphery of anode 11 will generate a similarly rotating plasma region which, over time, would define and appear as a disc shaped region 16.

Rotation of the plasma arc may be induced by generation of a magnetic field having flux lines at right angles to all points along the circular perimeter of anode 11. One established technique for furnishing such a magnetic field is the use of a so-called Hemholtz coil arrangement in which two coils 33 and 34 of greater diameter than that of anode 11 are positioned in longitudinal axial alignment with anode 11 radially outward of both ends of chamber 25. Upon excitation by a suitable direct current source 35 the requisite stationary magnetic field is established with a highly uniform field magnitude and direction. Ring supports 36 and 37 having a plurality of individually adjustable set screws 39 may be provided for support of chamber 25 so that corrections may be made in the alignment of the magnetic field with that of chamber 25.

It should be understood that although a Hemholtz coil configuration has been found to induce an acceptable magnetic field, apparatus 10 may employ any device or method which would furnish a field, either stationary or time-varient, that would induce the desired motion of the plasma region. Indeed, dependent upon the specific geometry utilized for material deposition and characteristics of the deposition material, motions other than circular may be preferred for different applications.

Arc current power supply 15 includes a low voltage (for example, between approximately 30 to 200 volts), low magnitude direct current (for example, between approximately 2 to 10 amperes) power source for electrical connection between anode 11 and cathode 12. The exact voltage and current necessary to maintain the arc plasma will be principally dependent upon the ionization potential of the deposition material and the separation between anode 11 and cathode 12. However, as lower magnitude currents have been found to be most conducive to non-LTE conditions, it is preferable to utilize the minimum current magnitude necessary to excite the atomic species of the material of interest. For example, successful operation with graphite electrodes separated approximately 9 mm with argon as the carrier gas and zinc as the deposition material has been effected with as little as 2 amperes at 35 volts.

Arc current power supply 15 should be regulated in any of the numerous manners well-known to the skilled artisan as fluctuations in current magnitude may adversely affect arc plasma motion. Additionally, power supply 15 may incorporate a High voltage impulse generator such as a Tesla coil to furnish the potential required to cause initial breakdown of the gas introduced beween anode 11 and cathode 12 and the striking of an arc therebetween.

Several techniques are available for introduction of the deposition material into the carrier gas in chamber 25. First, a reservoir 40 may be bored in cathode 12 a short distance behind its tapered end 20 and a powdered supply of the desired deposition material placed therein. During operation, cathode 12 in the vicinity of the reservoir reaches temperatures sufficient to vaporize the deposition material, which is carried into the arc plasma by the carrier gas, and activated into states where its atomic species exist in the plasma, which species are then transported by the carrier gas to the deposition site. Although straightforward, the use of reservoir 40 requires periodic shutdown of apparatus 10 for replenishment of this finite material supply.

Figure 4:
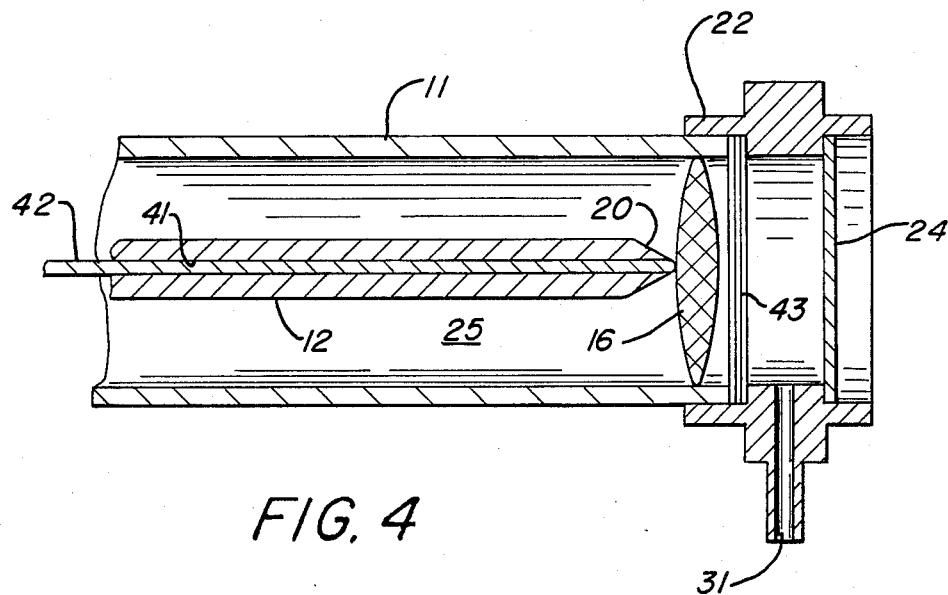
FIG. 4 is a side elevational view of an alternate apparatus in accordance with the present invention having a continuous feed mechanism for the introduction of the deposition material into the plasma, and a deposition substrate surface internal to the anode in the region of the plasma arc.

Instead of or in addition to the use of reservoir 40, as shown in FIG. 4 a small bore 41 may be made through the longitudinal axis of cathode 12 and the deposition material 42 continuously fed into chamber 25 therethrough. Here again temperatures in the vicinity of tapered end 20 would vaporize the deposition material 42 for introduction into the arc plasma.

Instead of or in addition to the use of reservoir 40 or small bore 41, the deposition material may be vaporized within chamber 25 by means for applying heat from an energy source, such as a laser placed external to chamber 25. The laser beam utilized could pass through the sapphire end plates 23, 24, which end plates in another embodiment could also provide optical access for still or motion photographic equipment, including real-time video monitors.

The deposition material may be vaporized externally to apparatus 10 and injected into the carrier gas prior to its entrance into chamber 25. In this instance, however, it may be necessary to preheat the carrier gas and maintain it at an elevated temperature so that the vaporized deposition material does not condense prior to introduction into the arc plasma.

Deposition may take place in a region either within chamber 25 as best depicted in FIG. 4, or externally to chamber 26 as shown in FIGS. 1 and 3. When depositions are to be made within chamber 25, a substrate 43 may be interposed between the end of anode 11 and the housing 22, opposite the end plate 23, through which cathode 12 enters chamber 25. In this instance cathode 12 is extended within chamber 25 until arc plasma region 16 is either adjacent or in spaced apart relation to substrate 43.

Deposition external of chamber 25 may be effected by inclusion of an exit orifice 44 within anode 11. Inasmuch as the periphery of the arc has been found to contain the greatest concentration of species in non-LTE conditions, appropriate alignment of arc plasma region 16 in slight offset proximity to exit orifice 44 will result in a jet stream of plasma exiting chamber 25 therethrough, permitting the most efficient deposition upon any substrate positioned within the jet stream of plasma.

Microspheroidal substrates such as glass microballons may be removably mounted within chamber 25 by utilization of a mounting stalk communicating through a suitable opening in chamber 25. In addition, for complete and uniform deposition of the coating material, such substrates may be positioned within chamber 25 or levitated by means of a gas suspension jet or a laser beam (not shown) entering chamber 25.

Multiple arc plasma regions, useful for establishing a greater concentration of species of the deposition material in the substrate area, may be established by the insertion of additional cathodes into chamber 25. Merely by way of example, a second cathode (not shown) may be inserted into chamber 25 as illustrated in FIGS. 1 and 3 through end plate 24 in the same manner as that of cathode 12.

Apparatus 10 operates to generate arc plasmas in relatively high pressure (for example, from approximately 0.1 to 3 atmospheres) and exhibiting non-LTE conditions preferable for the deposition of various materials on a variety of substrates such as quartz, glass or metal, as set forth above. With regard to the embodiment most favorably depicted in FIG. 3, in preparation for operation, a supply of the deposition material, include which as set forth above may but is not limited to silicon, other semiconductor dopant or component elements, metals and particularly metals having a moderate to high ionization potential, is placed in powdered form in reservoir 40, and cathode 12 placed in chamber 25 so that its tapered end 20 is proximate exit orifice 44. A carrier gas, preferably of an inert element such as argon, is passed through chamber 25 via gas ports 30 and 31, thereby purging chamber 25 of other gases.

Active operation is begun by the energization of coils 33 and 34 with power furnished by direct current source 35 so as to establish the magnetic field by which rotation of the plasma region is induced. Next the Tesla coil in arc current power supply 15 generates a high voltage impulse resulting in an arc being struck between tapered end 20 of cathode 12 and the inner periphery of the anode radially closest thereto. Contemporaneously therewith arc current power supply 15 impresses across anode 11 and cathode 12 the low voltage, direct current sufficient to maintain the established arc in the preselected gaseous carrier. The plasma produced by the arc reaches temperatures of several thousand degrees. The heat produced by the arc is conducted to the cathode, vaporizing the metal or other deposition material for transport into the arc plasma for activation into states were its species exist in the plasma. The carrier gas further transports these species out exit orifice 44 where anything in that vicinity (such as glass microballon targets as used in nuclear fusion reactions or flat substrates) may be uniformly coated with the coating material at thickness of from less than one micron to several microns. As previously noted, the substrate to be coated could be mounted within anode 11, and cathode 12 appropriately positioned such that the species strike the substrate.

EXAMPLES

Utilizing the arc plasma generating apparatus of the Figures, a mixture of zinc metal and zinc oxide was deposited onto a flat quartz substrate.

EXAMPLE 1

A quartz substrate was placed into the apparatus as shown in FIG. 4, within chamber 25 (interior to anode 11). Zinc was introduced to the plasma by placing granules of zinc metal into reservoir 40 (FIG. 3) on the cathode 12. As the cathode was heated by passage of current, the zinc sublimed and was carried into the plasma by argon carrier gas containing trace amounts of oxygen, introduced at a pressure of about 1 atmosphere at the cathode through gas port 30. The quartz substrate was positioned 12 mm from the cathode. An arc was struck by impressing a potential on the electrodes, and the rotating plasma was set up by the impression of a magnetic field by the energization of coils 33 and 34. The electrical conductivities of the resulting zinc metal/zinc oxide coatings were found to vary between conductive and semiconductive.

EXAMPLE 2

Depositions were conducted with the plasma generating apparatus operating in air, except that argon was introduced into chamber 25 gas ports 30 and 31, and a substrate was placed external to chamber 25 in front of exit orifice 44. An arc was struck as in Example 1, and zinc was sublimed from reservoir 40 and cathode 12, carried to the rotating arc plasma 16 where excitation or activation of atomic zinc species occurred. The activated zinc coating material was carried by the argon gas through the exit orifice 44 to strike and deposit as zinc oxide upon the substrate. The arc current utilized was 3 amps, and the magnetic field was 200 gauss. Temperature in the jet emitted from the exit orifice was approximately 400° C. The substrate was introduced after 7 minutes when the zinc concentration in the plasma had stabilized, and was placed 15 mm from the exit orifice. Profilometry showed that a coating of approximately 700 nm was obtained in a deposition period of 3 minutes, the coating comprising zinc oxide.

These examples demonstrate that coatings can be achieved utilizing non-local thermal equilibrium arc plasmas to generate active species of coating materials. Deposition rates are increased greatly over prior art processes which utilize low pressure plasma sources. Where it is desired to eliminate the formation of oxides, the plasma generating apparatus may be enclosed in a chamber which is filled with an inert gas such as argon at slightly greater than the pressure at which the deposition is carried out. This prevents oxygen in ambient air from being introduced into the plasma and reacting with the active species generated.

Thus it should be apparent to those skilled in the art that the subject invention accomplishes the objects set forth above. It is to be understood that the subject invention is not to be limited by the examples set forth herein. These have been provided merely to demonstrate operability and the selection of specific substrates, coating materials, electrode materials, and process parameters such as temperature, pressure, arc current and the like can be determined from the total specification disclosure provided without departing from the spirit of the invention herein disclosed and described, the scope of the invention including modifications and equivalent embodiments that fall within the scope of the attached claims.

We claim:

1. A method for coating substrates comprising generating a non-LTE arc plasma at a pressure graater than about 0.1 atmospheres, said plasma being generated by the flow of a current of from about 2 to about 10 amps between a cathode and an anode proximate to the cathode, a voltage of from about 20 volts to about 200 volts being impressed across the cathode and the anode;
  introducing a coating material into the arc plasma;
  positioning a substrate material proximate to the arc plasma, whereby activated species of said coating material formed by the arc plasma contact the substrate to form a coating.

2. A method as in claim 1, wherein motion of the arc plasma is induced.

3. A method as in claim 2 including the step of rotating said arc plasma.

4. A method as in claim 1, wherein the substrate material is positioned at the periphery of said arc plasma.

5. A method as in claim 1, wherein a carrier gas contacts the arc plasma to carry active species of the coating material to the substrate.

6. A method as in claim 5, wherein the carrier gas introduces the coating material to the arc plasma.

7. A method as in claim 5, wherein said carrier gas is an inert gas.

8. A method as in claim 1, wherein said coating material comprises a metal.

9. A method as in claim 1, wherein said coating material comprises semiconductor component elements.

10. A method as in claim 1, wherein said substrate is electrically conductive.

11. A method as in claim 1, wherein said substrate is a glass microballoon.

12. A method as in claim 1, wherein said pressure is between about 0.1 to about 3 atmospheres.

13. A method as in claim 1, wherein said pressure is about 1 atmosphere.

14. A method as in claim 1, wherein said current is between about 3 to about 6 amps.

15. A method as in claim 1 including introducing a coating material by disposing said coating material on or in the cathode and vaporizing said coating material.

16. A method as in claim 1 including introducing a coated material into the arc plasma by vaporizing said coating material in the region of the cathode and an anode by an external energy source.

17. A method as in claim 16, wherein said external energy source is a laser.

18. A method as in claim 1 wherein said coating material is selected from zinc, copper, nickel, cobalt, iron, cadmium, silver, gold, platinum and palladium.

19. A method as in claim 1 including introducing the coating material into the arc plasma in the form of a gas.

20. A method as in claim 1, wherein the temperature of the periphery of said arc plasma is between about 200° C. to about 800° C.

21. A method for making a semiconductor comprising
generating a non-LTE arc plasma at a pressure greater than about 0.1 atmospheres, said plasma being generated by the flow of a current of from about 2 to about 10 amps between a cathode and an anode proximate to the cathode, a voltage of from about 20 volts to about 200 volts being impressed across the cathode and the anode;
introducing at least one semiconductor component element into the arc plasma;
positioning a substrate material proximate to the arc plasma, whereby activated species of said semiconductor material formed by the arc plasma contact the substrate to form a semiconductive region.

22. A method as in claim 21, wherein movement of the arc plasma is induced.

23. A method as in claim 22 including the step of rotating said arc plasma.

24. A method as in claim 21, wherein a carrier gas contacts the arc plasma to carry active species of the semiconductor element to the substrate.

25. A method as in claim 21, wherein said substrate is electrically conductive.

26. A method as in claim 21, wherein said pressure is between about 0.1 to about 3 atmospheres.

27. A method as in claim 21, wherein said pressure is about 1 atmosphere.

28. A method as in claim 21, wherein said semiconductor element comprises silicon.

29. A method as in claim 28, wherein said semiconductor element additionally comprises at least one dopant element.

30. A method as in claim 29, wherein said dopant element is selected from arsenic, phosphorus, and nitrogen.

31. A method as in claim 29, wherein said dopant element is selected from boron, aluminum and gallium.

32. A method as in claim 21, wherein said semiconductor element comprises germanium.

33. A method of making a photovoltaic semiconductor device including
generating a non-LTE arc plasma at a pressure greater than about 0.1 atmospheres, said plasma being generated by the flow of a current of from about 2 to about 10 amps between a cathode and an anode proximate to the cathode, a voltage of from about 20 volts to about 200 volts being impressed across the cathode and the anode;
introducing at least one photoresponsive semiconductor component element into the arc plasma;
positioning a substrate material proximate to the arc plasma, whereby activated species of said semiconductor element formed by the arc plasma contact the substrate to form a semiconductor region.

34. A method as in claim 33 including introducing a seminconductor dopant material into the arc plasma such that at least one doped semiconductor region is formed.

35. A method as in claim 34, wherein an n-type dopant element is introduced to the arc plasma.

36. A method as in claim 34, wherein a p-type dopant element is introduced into the arc plasma.

37. A method as in claim 35, wherein said dopant is selected from arsenic, phosphorus and nitrogen.

38. A method as in claim 36, wherein said dopant is selected from boron, gallium and aluminum.

39. A method as in claim 33, wherein said semiconductor element comprises silicon.

40. A method as in claim 33, wherein said semiconductor element comprises germanium.

41. A method as in claim 33, wherein said substrate material is electrically conductive.

42. A method as in claim 34, wherein said semiconductor device comprises at least one region each of p-type, intrinsic and n-type semiconductor material.

43. A method as in claim 33 including providing electrical conductors to conduct the flow of electricity produced by illuminating said semiconductor device.

44. A method for coating substrates comprising
establishing electric field conditions in which an arc plasma may exist in non-local thermal equilibrium between a first electrode and a second electrode proximate said first electrode by generating a flow of current of from about 2 to about 10 amps between said first electrode and said second electrode,
establishing a magnetic field in the region of said first electrode and said second electrode to induce motion of the arc plasma,
establishing and maintaining at least in a region between the first electrode and second electrode a preselected gaseous environment at a pressure of at least approximately 0.1 atmospheres,
introducing a coating material into the arc plasma, and
positioning a substrate material proximate to the arc plasma, whereby activated species of said coating material formed by the arc plasma contact the substrate to form a coating.

45. A method as in claim 44, wherein rotation of the arc plasma is induced.

46. A method as in claim 44, wherein said preselected gaseous environment comprises an inert gas.

47. A method as in claim 44, wherein said preselected gaseous environment excludes oxygen.

48. A method as as in claim 44, wherein the substrate material is positioned at the periphery of said arc plasma.

49. A method as in claim 44, wherein said coating material comprises a metal.

50. A method as in claim 44, wherein said coating material comprises semiconductor component elements.

51. A method as in claim 44, wherein said substrate is electrically conductive.

52. A method as in claim 44, wherein said substrate is a glass microballoon.

* * * * *